United States Patent [19]
Koehnke et al.

[11] Patent Number: 5,940,025
[45] Date of Patent: Aug. 17, 1999

[54] NOISE CANCELLATION METHOD AND APPARATUS

[75] Inventors: Mark A. Koehnke, Attleboro; W. Roger Melick, Sudbury; Raoul E. Plutchak, Boxborough; Stephen Rego, Franklin, all of Mass.; Steve B. Santangelo, Cumberland, R.I.

[73] Assignee: Raytheon Company, Lexington, Mass.

[21] Appl. No.: 08/929,934

[22] Filed: Sep. 15, 1997

[51] Int. Cl.⁶ .............................. G01S 7/292; G01S 7/40
[52] U.S. Cl. .................. 342/159; 342/175; 342/100; 342/102; 330/2; 330/43
[58] Field of Search .................. 342/159, 89, 91, 342/93, 98, 100, 101, 102, 103, 162, 175, 195, 203; 330/2, 4.6, 10, 43, 149, 151

[56] References Cited

U.S. PATENT DOCUMENTS

| | | | |
|---|---|---|---|
| 3,626,311 | 12/1971 | Kraybill | 340/825.44 |
| 3,836,873 | 9/1974 | Healey, III et al. | 331/116 R |
| 3,878,481 | 4/1975 | Healey, III | 331/105 |
| 3,917,998 | 11/1975 | Welti | 455/13.1 |
| 3,999,113 | 12/1976 | McCoy | 363/55 |
| 4,276,514 | 6/1981 | Huang | 330/149 |
| 4,328,591 | 5/1982 | Baghdady | 455/303 |
| 4,513,249 | 4/1985 | Baghdady | 327/356 |
| 4,532,478 | 7/1985 | Silagi | 330/151 |
| 4,929,906 | 5/1990 | Voyce et al. | 330/149 |
| 5,103,187 | 4/1992 | Durand et al. | 330/43 |
| 5,126,687 | 6/1992 | Onoda et al. | 330/149 |
| 5,148,117 | 9/1992 | Talwar | 330/151 |
| 5,155,448 | 10/1992 | Powell | 330/149 |
| 5,157,345 | 10/1992 | Kenington et al. | 330/149 |
| 5,157,346 | 10/1992 | Powell et al. | 330/151 |
| 5,172,071 | 12/1992 | Braathen | 330/129 |
| 5,175,879 | 12/1992 | Ellingson et al. | 455/126 |
| 5,396,189 | 3/1995 | Hays | 330/149 |

Primary Examiner—John B. Sotomayor
Attorney, Agent, or Firm—Fish & Richardson P.C.

[57] ABSTRACT

A radar transmitter for producing a radar signal in response to a radar trigger signal fed thereto. The transmitter includes a radio frequency oscillator for producing a signal having a radio frequency carrier to be used in each transmitted radar signal. The signal produced by the oscillator is amplified by a radio frequency amplifier. In response to the system trigger signal, the transmitter is configured in a normal operating mode to operate with three noise cancellation loops; i.e., an automatic level control loop (ALC); an amplitude modulation noise cancellation loop (AM noise cancellation loop); and a phase modulation noise (PM noise cancellation loop). In response to the system trigger signal, the normal operating mode is preceded with two calibration modes: an AM noise calibration mode used to determine a nominal operating point for the AM noise calibration mode; and a subsequent phase modulation (PM) noise calibration mode used to establish a nominal operating point for the PM noise calibration mode. During the AM noise calibration mode, a nominal operating level is determined which places the TWT amplifier slightly below saturation.

19 Claims, 8 Drawing Sheets

NOISE CANCELLATION METHOD AND
APPARATUS

This invention was made with Government support under Department of the Navy Contract No. N00024-93-C-5130 awarded by the United States Navy.

BACKGROUND OF THE INVENTION

This invention relates to apparatus and method for canceling noise and more particularly to apparatus and method for canceling amplitude and phase modulation noise in amplifiers.

As is known in the art, amplifiers are used in a wide variety of applications. In a radar system application, an amplifier, such as a travelling wave tube (TWT) amplifier, is used to amplify a local oscillator signal having the carrier frequency of the radar signal to be transmitted. In response to a radar system trigger signal, the TWT is activated to thereby produce at its output the high power radar signal.

As is also known in the art, because of thermal noise within the TWT amplifier and the effects of ripple in the power supply used to power the TWT amplifier, the amplified radio frequency signal will contain, in addition to the carrier frequency, other unwanted frequency components. These unwanted frequency components, i.e., amplitude modulation (AM) noise and phase modulation (PM) noise, can detract from the performance of the radar system.

One method suggested to reduce this amplitude modulation noise is to provide an electronically controllable attenuator at the input to the TWT amplifier and to feed a small portion of the power from the output as the control signal for the attenuator. Such an arrangement, however, prevents the TWT from operating at maximum power thereby reducing the detectable target range of the radar.

SUMMARY OF THE INVENTION

In accordance with the invention, a method is provided for suppressing amplitude modulated noise. The method includes the steps of driving an amplifier towards saturation while monitoring a ratio of amplifier output power to input power; and, terminating said driving when the monitored ratio indicates the amplifier is operating at a predetermined level below saturation (i.e., a predetermined level below the amplifier's maximum output level). The amplifier is operated at the determined operating point (i.e., at a predetermined level below saturation) during a subsequent normal operating mode to suppress amplitude modulation noise.

In accordance with another feature of the invention, a method is provided for canceling phase modulation noise in a system having a phase detector fed by a portion of an input signal to the phase modulation noise cancellation system and an electronically controllable phase modulator fed by another portion of the input signal. The electronically controllable phase modulator produces an output signal fed to an output of the phase noise cancellation system. A feedback phase shifter is fed by an output from the phase noise cancellation system for changing the phase shift of the signal fed thereto in accordance with a control signal. The phase shifted signal produced by the feedback phase shifter is fed as a second input signal to the phase detector. The method includes the steps of: (a) during a calibration mode: (i) setting an initial value for the feedback phase shifter with the control signal; (ii) sequentially changing phase shift with the control signal while measuring a voltage produced by the phase detector to control the phase shift provided by the phase detector to the signal fed thereto; and (iii) determining when the voltage produced by the phase detector passes through a predetermined level with a predetermined slope polarity; and (b) during a subsequent normal operating mode, setting the feedback phase shifter to such value as a nominal operating point. With such method, the calibration mode drives the system to a stable, negative feedback operating point which is used as the nominal operating point during the normal operating mode.

In accordance with another feature of the invention, a method is provided for canceling noise in a radar system transmitter, comprising the steps of: determining a nominal operating point for an AM noise cancellation loop in response to a system trigger signal; and, using such nominal operating point during a subsequent normal operation mode.

In accordance with another feature of the invention, a method is provided for canceling noise in a radar system transmitter, comprising the steps of: determining nominal operating points for an PM noise cancellation loop in response to a system trigger signal; and, using such nominal operating point during a subsequent normal operation mode.

In accordance with still another feature of the invention, a radar transmitter is provided for producing a radar signal in response to a radar trigger signal. The transmitter includes a radio frequency oscillator for producing a signal having a radio frequency carrier to be used in each transmitted radar signal. The signal produced by the oscillator is amplified by a radio frequency amplifier. In response to the system trigger signal, the transmitter is configured in a normal operating mode to operate with three noise cancellation loops; i.e., an automatic level control loop (ALC); an amplitude modulation noise cancellation loop (AM noise cancellation loop); and a phase modulation noise cancellation loop (PM noise cancellation loop). In response to the system trigger signal, the normal operating mode is preceded with two calibration modes: an AM noise calibration mode used to determine a nominal operating point for the AM noise calibration mode which places the TWT amplifier slightly below saturation; and a subsequent phase modulation (PM) noise calibration mode used to establish a nominal operating point which places the PM noise cancellation loop at a stable, negative feedback operating point.

BRIEF DESCRIPTION OF THE DRAWING

These and other features of the invention, as well as the invention itself, will become more readily apparent from the following detailed description taken together with the accompanying drawings, in which.

DESCRIPTION OF THE PREFERRED EMBODIMENTS

Figure 1:
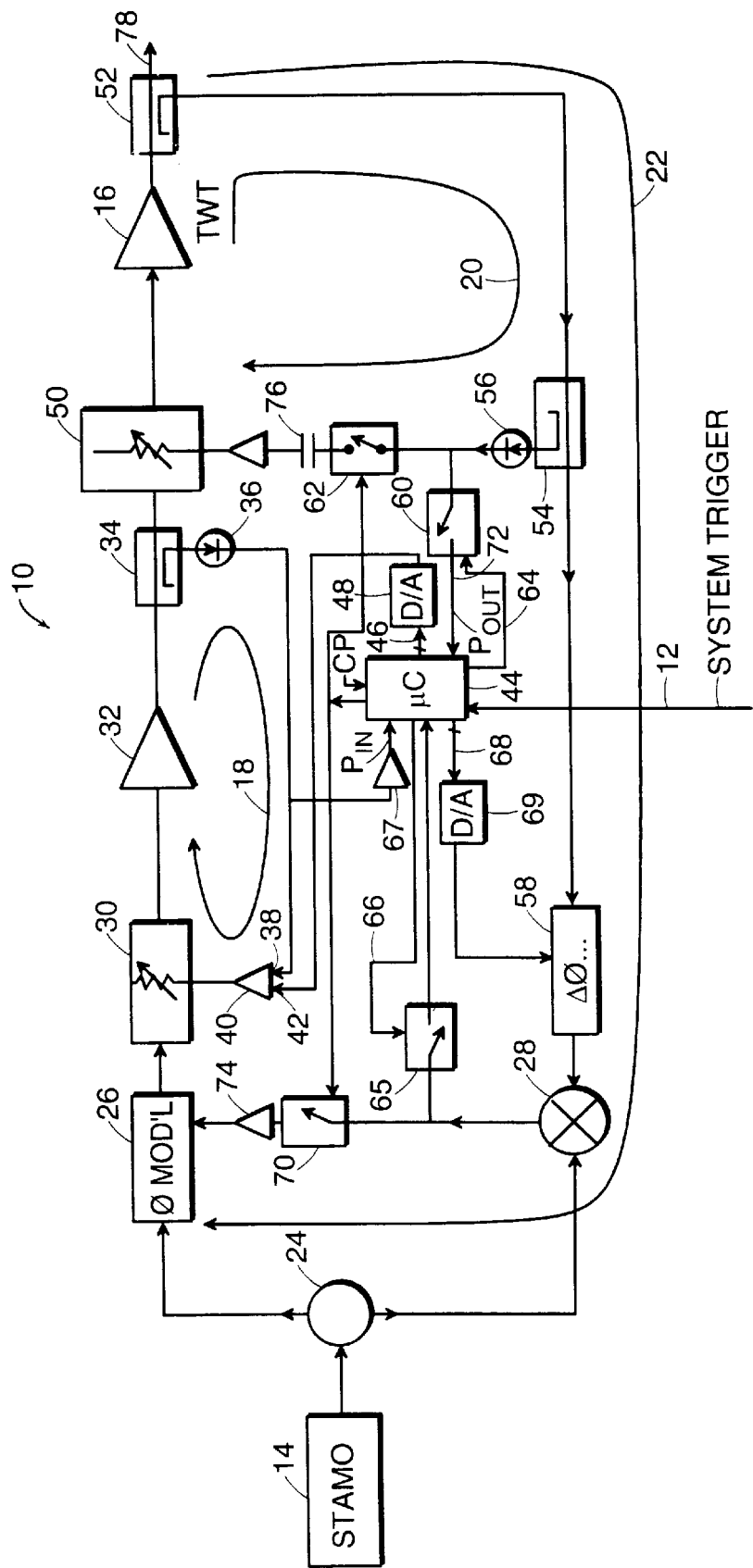
FIG. 1 is a block diagram of a radar transmitter in accordance with the invention.
Figure 4:
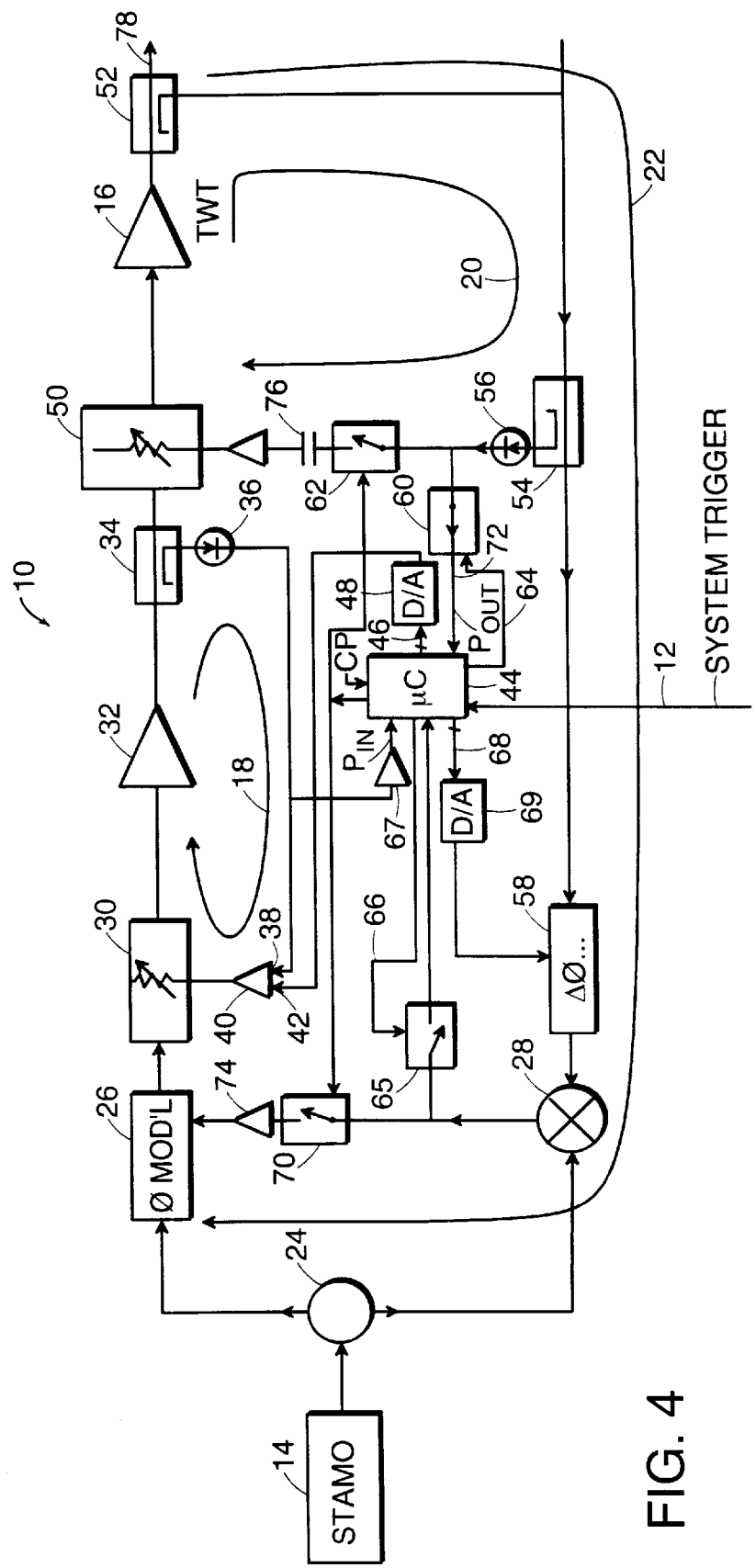
FIG. 4 is a block diagram of the radar transmitter of FIG. 1 shown configured in an amplitude modulation (AM) noise calibration mode, such mode being used prior to the normal operating mode.
Figure 5:
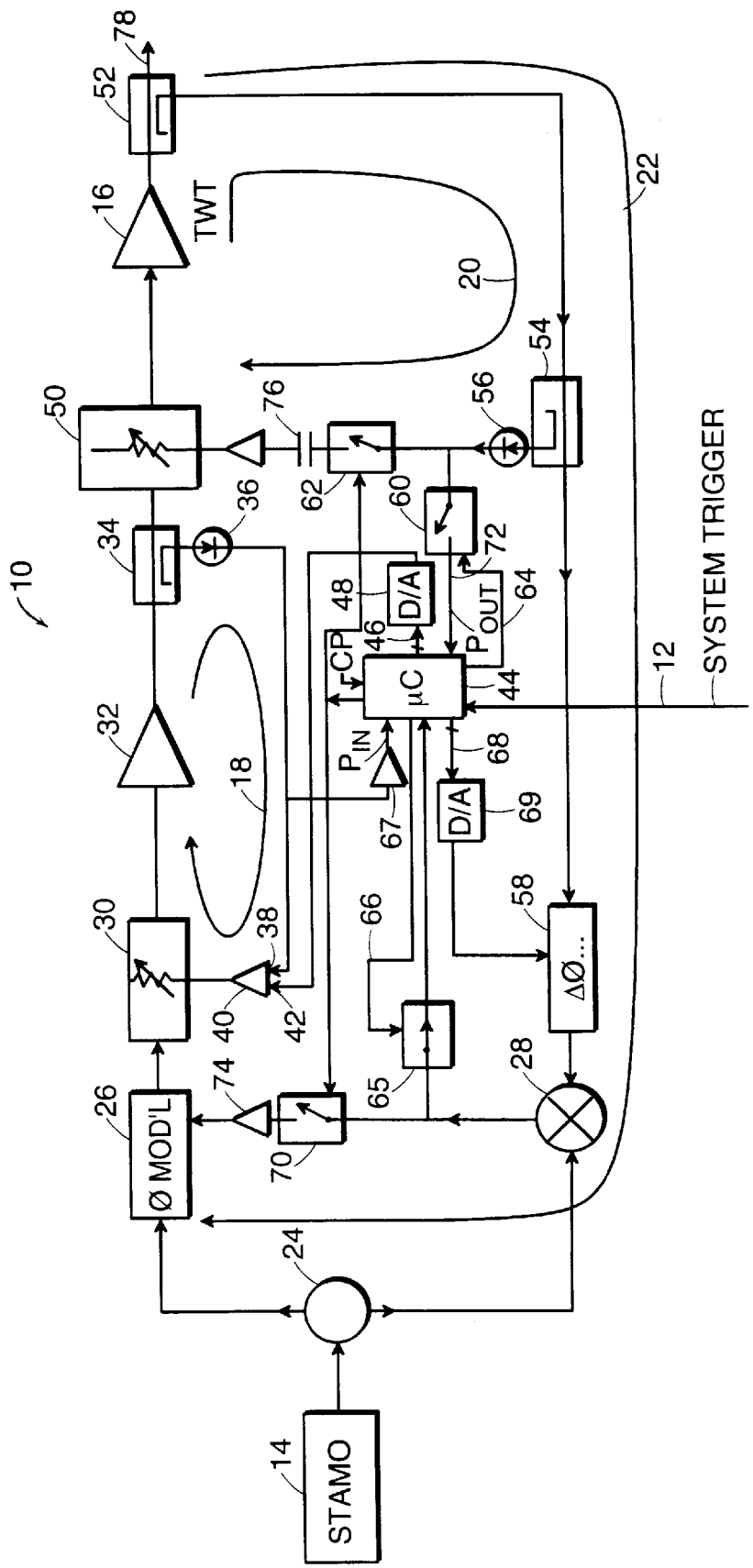
FIG. 5 is a block diagram of the radar transmitter of FIG. 1 shown configured in an phase modulation (PM) noise calibration mode, such mode being used prior to the normal operation and subsequent to the AM noise calibration mode.

Referring now to FIG. 1, a radar transmitter 10 is shown for producing a radar signal in response to a radar trigger signal fed thereto on line 12. The transmitter 10 includes a radio frequency oscillator 14, here a stable master oscillator (STAMO), for producing a signal having a radio frequency carrier to be used in each transmitted radar signal. The signal produced by the STAMO 14 is amplified by a radio frequency amplifier, here, for example, a travelling wave tube (TWT) amplifier 16. In response to the system trigger signal on line 12, the transmitter 10 is configured in a normal operating mode, shown in FIG. 2, to operate with three noise cancellation loops; i.e., an automatic level control loop (ALC) 18; an amplitude modulation noise cancellation loop (AM noise cancellation loop) 20; and a phase modulation noise (PM noise cancellation loop) 22. As will be described in more detail in connection with FIG. 3, in response to the system trigger signal on line 12, the normal operating mode is preceded with two calibration modes: an AM noise calibration mode used to determine a nominal operating point for the AM noise calibration mode; and a subsequent phase modulation (PM) noise calibration mode used to establish a nominal operating point for the PM noise calibration mode. During the AM calibration mode, transmitter 10 is configured as shown in FIG. 4 and during the PM calibration mode, transmitter 10 is configured as shown in FIG. 5. The AM noise calibration mode uses a process to be described in detail in connection with FIG. 6 and the PM noise calibration mode uses a process to be described in detail in connection with FIG. 7. Briefly, during the AM noise calibration mode, a nominal operating level is determined which places the TWT amplifier slightly below saturation. During the phase modulation noise calibration mode, a nominal operating point is established which places the PM noise cancellation loop 22 in a stable, negative feedback loop configuration for the nominal operating mode.

Referring again to FIG. 1, the transmitter 10 includes a power divider 24 for coupling one portion of the radio frequency signal produced by STAMO 14 to a phase modulator 26 and another portion of the radio frequency signal produced by STAMO 14 to a phase detector 28. A first electronically controlled variable attenuator 30 is fed by the phase modulator 26. An amplifier 32 is fed by the attenuator 30. A directional coupler 34 couples a small portion of the signal produced at the output of the amplifier 32 to a diode detector 36. The diode detector 36 produces a signal representative of the relative power in the signal produced at the output of the amplifier 32 and present at the input to the TWT 16. The output of the diode detector 36 is fed to a first input 38 of a differencing amplifier 40. The second input 42 of the differencing amplifier 40 is produced by a microcontroller 44 via a digital to analog converter 48. Here, the microcontroller 44 includes a microprocessor, here an Intel 87C196. The nature and development of the signal produced at the second input 42 to the differencing amplifier 40 will be described in detail hereinafter. Suffice it to say here, however, that during the normal operating mode, (i.e., subsequent to an initial AM noise calibration mode and PM noise calibration mode) the level represented by data produced by the microcontroller 44 on bus 46 is fed, after being converted to corresponding analog signal by digital to analog (D/A) converter 48, to the second input 42 to the differencing amplifier 40. The level of the data on bus 46 establishes the nominal drive level of the signal fed to the TWT amplifier 16 to place such TWT amplifier 16 slightly below, the TWT amplifier 16 saturation point. The level of the data produced by the microcontroller 44 on bus 46 is determined during the amplitude modulation (AM) noise calibration mode when the transmitter 10 is configured as shown in FIG. 4 and operating in accordance with an AM noise cancellation mode to be described in detail below in connection with FIG. 6.

Referring again to FIG. 1, a second electronically controllable variable attenuator 50 is fed, via the directional coupler 34, by the major portion of the signal produced by the amplifier 32. The travelling wave tube (TWT) amplifier 16 is fed by the second electronically controllable variable attenuator 50. A small portion of the amplified signal produced by the TWT amplifier 16 is fed, via directional couplers 52, 54 to a second diode detector 56 and to an electronically controllable phase shifter 58, as shown. The major portion of the signal produced by the TWT amplifier 16 is fed, via directional coupler 52, to the transmitter 10 output 78.

The phase shifter 58 provides a second input to the phase detector 28. The output of the second diode detector 56 is fed to a first switch 60 and to a second switch 62. The first switch 60 is controlled by the microcontroller 44 via a signal on control line 64 for selectively coupling the output of the second detector 56 (i.e., a signal representative of the TWT amplifier 16 output power, $P_{out}$) to the microcontroller 44 via line 72 during the amplitude modulation (AM) calibration mode. The output of the first diode detector 36 (i.e, a signal representative of the input power, $P_{in}$, to the TWT amplifier 16) is fed to the microcontroller 44 via amplifier 67. The microcontroller 44 provides, in response to processing of a ratio of $P_{out}$ to $P_{in}$ in accordance with the AM noise calibration method to be described in detail in connection with FIG. 6 during the AM noise calibration mode, the level of the data at the second input 42 to the differencing amplifier 40 as mentioned above, during the normal operating mode. The microcontroller 44 operates the first switch 60 via the control signal on line 64 to decouple the second detector 56 from the microcontroller 44 when the transmitter 10 is configured during the phase modulation (PM) noise calibration mode as shown in FIG. 5 and during the normal operating mode as shown in FIG. 2.

A third switch 65 is fed by the phase detector 28. This third switch 65 is also controllable by the microcontroller 44 via a control signal on line 66 to couple the phase detector 28 to the microcontroller 44 during a phase modulation (PM) noise calibration mode, as shown in FIG. 5. The microcontroller 44 adjusts the electronically controllable phase shifter 58 via a signal on bus 68, after conversion to a corresponding analog signal by D/A converter 69 during the phase modulation (PM) noise calibration mode performed subsequent to the AM noise calibration mode when the microcontroller 44 closes the normally open third switch 65 via the control signal on line 66, in accordance with a method to be described in more detail in connection with FIG. 7. During the phase modulation noise calibration mode, the microcontroller 44 determines a nominal operating point of operation for the phase detector 28 for use during a subsequent normal operating mode which results in stable, negative feedback. The microcontroller 44 decouples the phase detector 28 from the microcontroller 44 during the amplitude modulation (AM) noise calibration mode (FIGS. 4 and 6) and the normal operating mode (FIG. 2).

Figure 2:
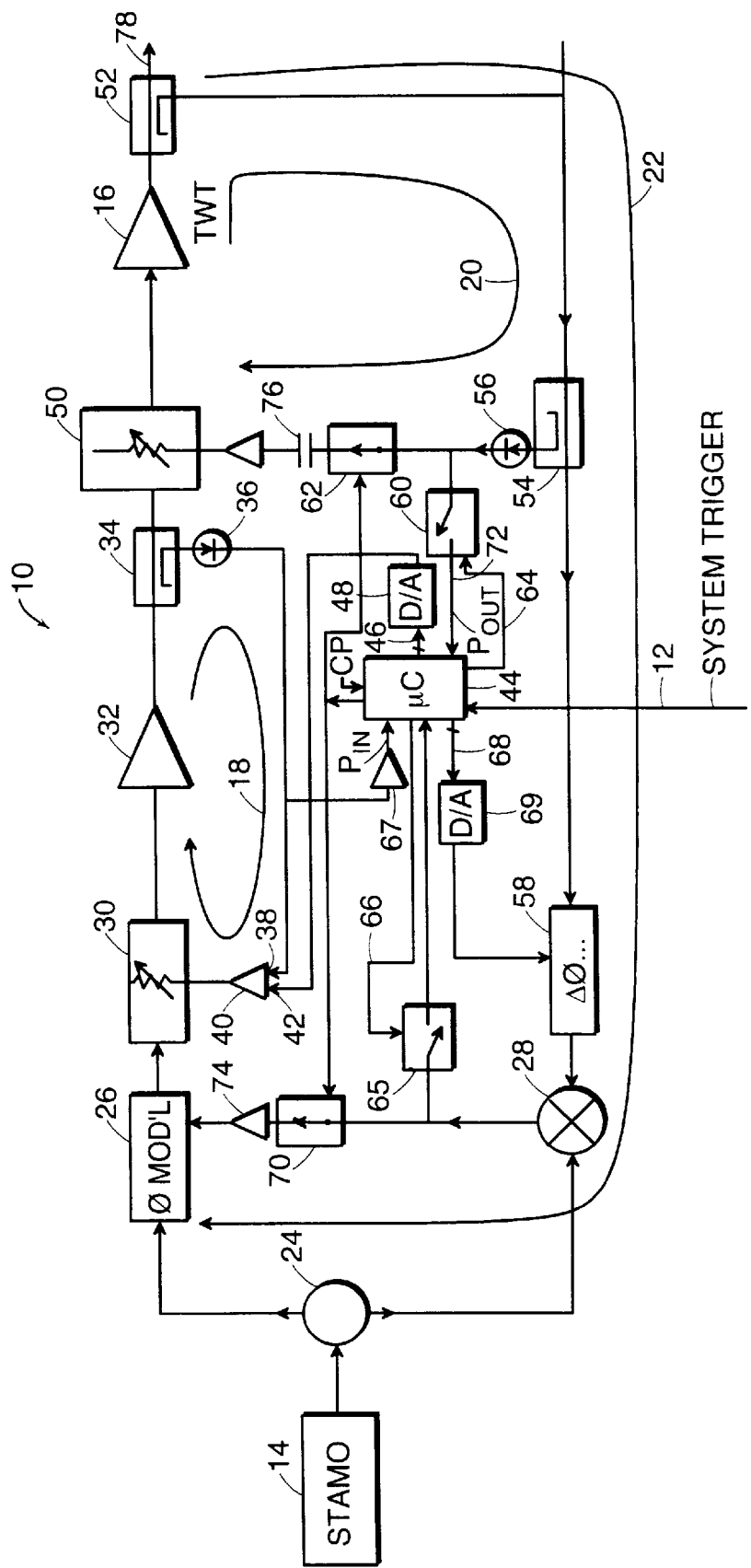
FIG. 2 is a block diagram of the radar transmitter of FIG. 1 shown configured in a normal operating mode.

Switch 70 is controllable by the microcontroller 44 for coupling the phase detector 28 to the electronically adjustable phase modulator 26, via amplifier 74 during the normal operating mode, as shown in FIG. 2. Also, the second detector 56 is coupled, via closed switch 62 to the second electronically controllable attenuator 50, via an AC coupling capacitor 76, during the normal operating mode, as shown in FIG. 2. It is noted that the microcontroller 44 decouples, via switches 70 and 62, the phase detector 28 from the electronically adjustable phase modulator 26 and the second detector 56 from the second electronically controllable attenuator 50 during the amplitude modulation (AM) noise calibration mode (FIGS. 4 and 6) and the phase modulation noise calibration (PM) mode (FIGS. 5 and 7).

Figure 3:
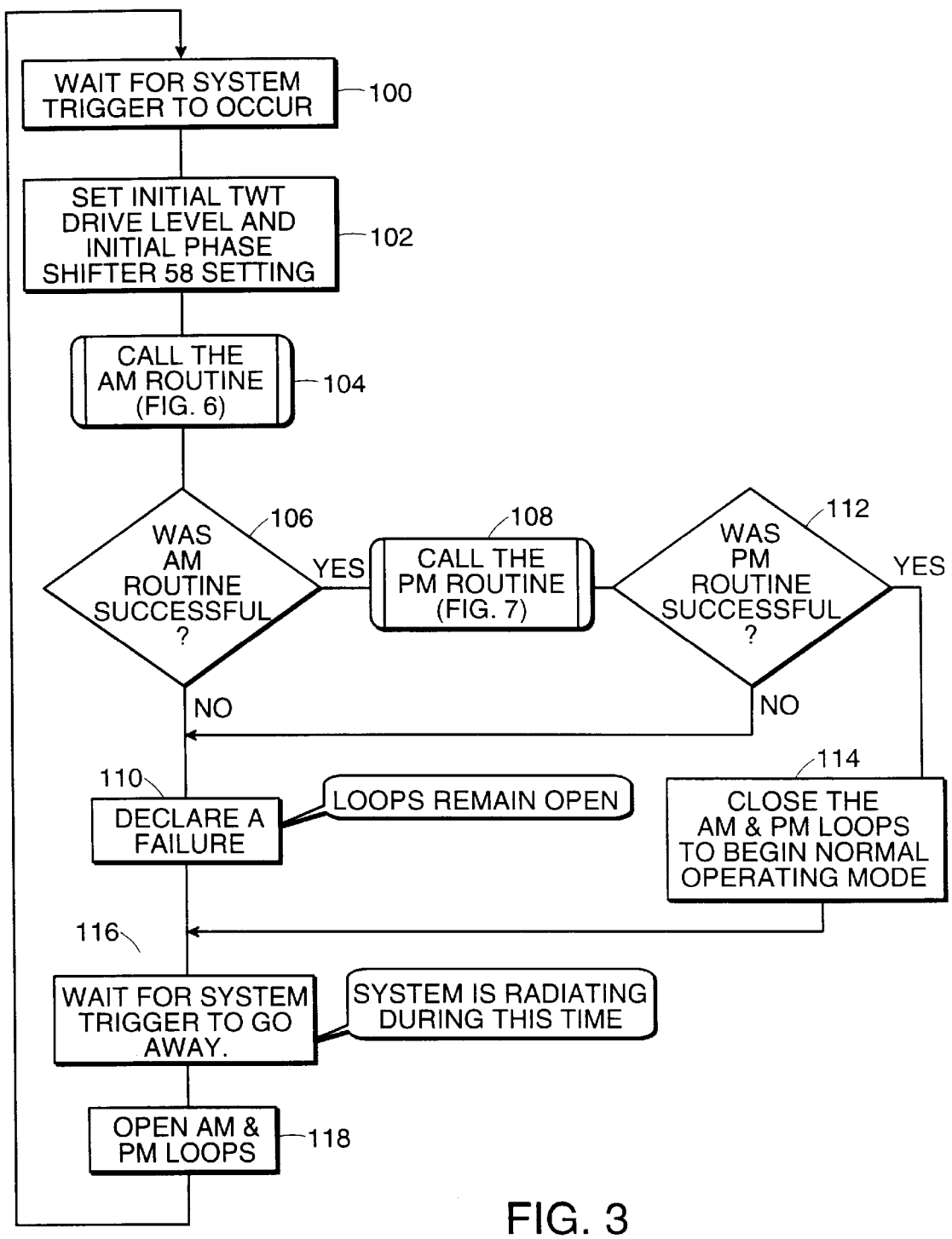
FIG. 3 is a flow diagram of a process used to control the radar transmitter of FIG. 1.

Briefly, and referring to FIG. 3, the transmitter 10 (i.e., microcontroller 44) waits for a system trigger on line 12 (Step 100). The microcontroller 44 next sets initial TWT amplifier 16 drive level (i.e., an initial level on bus 46) and an initial phase shifter 58 level (i.e., an initial level on bus 68), Step 102. Next, the microcontroller 44 calls for, and executes the AM noise calibration mode shown in FIG. 6 with the transmitter configured by the microcontroller 44 as shown in FIG. 4 (Step 104).

Next, the microcontroller 44 determines whether the AM noise calibration mode was executed successfully (Step 106). If the AM noise calibration mode was executed successfully, as determined by the microcontroller 44, the microcontroller 44 calls for, and executes the PM noise calibration mode, (Step 108). If, on the other hand, the microcontroller 44 determines that the AM noise calibration mode was not executed successfully in Step 106, the microcontroller 44 declares a "failure" (Step 110); it being noted that the loops 20 and 22 remain open, i.e., switches 60, 70, 62 and 65 remain open).

Figure 7:
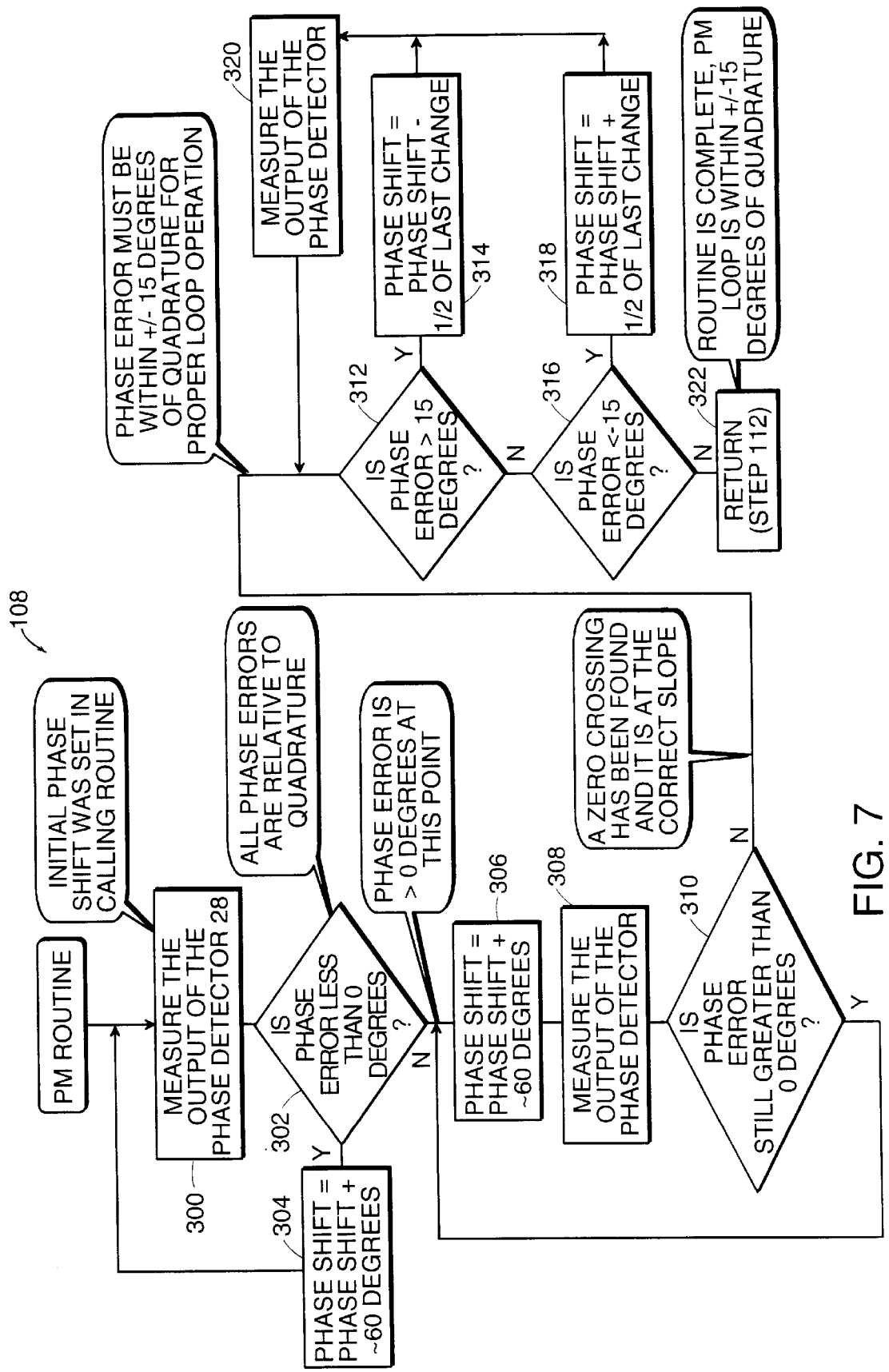
FIG. 7 is a flow diagram of a process used to control the radar transmitter of FIG. 1 during the PM noise calibration mode.

If, on the other hand, the microcontroller 44 determines that the AM noise calibration mode was executed successfully in Step 106, the microcontroller 44 calls for and executes the PM noise calibration mode, as described in FIGS. 5 and 7, (Step 108). Next, the microcontroller 44 determines whether the PM noise calibration mode was executed successfully (Step 112). If not successfully executed, a failure is declared by the microcontroller 44 (Step 110). If the PM noise calibration mode was successfully executed, the microcontroller 44 closes switches 70 and 62 (Step 114) to place the transmitter 10 in the normal operating mode (FIG. 2). It is noted that when placed in the normal operating mode, a switch, not shown, at the output of amplifier 67 is opened. (It should be noted that switch 60 was open after successful execution of the AM noise calibration mode. However, the level determined by the microcontroller 44 to drive the TWT amplifier 16 to an operating point slightly below saturation is stored in the D/A 48 and is fed to the second input 42 of differencing amplifier 40 during the normal operating mode and also during the PM noise calibration mode.) If, in Step 114, the transmitter 10 is placed in the normal operating mode, or if the microcontroller 44 declares a failure, Step 110, the microcontroller 44 waits for the system trigger on line 12 (Step 116) to terminate; it being noted that the TWT amplifier 16 produces a radar signal during this waiting period. When the radar signal terminates, the microcontroller 44 opens switches 62 and 70 (Step 118) and the microcontroller 44 waits for the next system trigger (Step 100).

Before discussing the AM noise calibration mode in more detail, it should first be noted that at the time of system trigger signal on line 12, a priori knowledge of the frequency of the radar signal is not known and therefore the saturation point of the TWT amplifier 16, which is a function of operating frequency is not known. Briefly, during the AM noise calibration mode, the saturation point of the TWT amplifier 16 is determined. More particularly, and referring to FIG. 4, the TWT amplifier 16 is driven towards saturation by the microcontroller 44 successively increasing the level of the signal fed to the second input 42 of the differencing amplifier 40 while the microcontroller 44 monitors a ratio of TWT amplifier output signal power, $P_{out}$, fed to the microcontroller 44 by the second diode 56 via closed switch 60 to the TWT amplifier 16 input power $P_{in}$ fed to the microcontroller 44 by the first diode detector 36 and amplifier 67. The microcontroller 44 terminates the increase in the level of the signal at the attenuator when the monitored ratio indicates the amplifier is operating at, or above, a predetermined level below saturation. Thus, referring to FIG. 8, the $P_{out}$ vs. $P_{in}$ gain curve 80 is shown for the TWT amplifier 16. It is first noted that the TWT amplifier 16 is driven into saturation when the input power $P_{in}$ increases to point "A" where the gain slope is 0 db/db. Operating the TWT amplifier 16 in saturation will minimize AM noise generated within the TWT amplifier 16 but not ripple in the power supply, not shown, used to power the amplifier 16. In order for the AM noise cancellation loop 22 to operate most effectively as a feedback control system during the normal operating mode, the TWT amplifier 16 must have an operating point slightly below saturation. The predetermined level below saturation is the result of a compromise between operating the TWT amplifier 16 with maximum output power but with sufficient "head room" for most effective feedback operation. Here, for example, an operating point on the gain curve 80 where the slope, i.e., ratio of $P_{out}$ to $P_{in}$ is 0.2 db/db (i.e., point "B" in FIG. 8) is selected as the nominal operating point for use by the transmitter 10 during the normal operating mode. It is noted that while point "C" is also below saturation, point "C" is at a point on the gain curve 80 with a slope magnitude of 0.2 db/db but with the polarity of the slope at point "C" being negative (i.e., beyond saturation). Selection of point "C" as the operating point during the normal operating mode would result in an unstable, positive feedback control loop unless an additional inverting amplifier, or polarity change is made in the feedback loop. Here, point "B" is selected. Thus, point "B", i.e., a slope of +0.2 db/db is determined by the microcontroller 44 in accordance with the method shown in FIG. 6.

To put it another way, the microcontroller 44 determines, during the AM noise calibration mode, a nominal operating point for use by the transmitter 10 which is slightly below saturation on the "positive slope side" (i.e., where an increase in TWT amplifier 16 input signal level, $P_{in}$, produces an increase in TWT amplifier 16 output signal level, $P_{out}$). That is, while operating the TWT amplifier 16 in saturation minimizes AM noise, in order to provide a feedback control loop to adjust the operating point of the TWT amplifier 16 in the event there is a change in the radar signal carrier frequency, the TWT amplifier 16 is placed by the microcontroller 44 at a nominal operating point slightly below saturation, here where the gain curve 80 slope is slightly below saturation, e.g., +0.2 db/db. Further, in order for there to be a negative feedback loop created, the point slightly below saturation must be on the "positive slope side" of the gain curve 80, as described above.

Figure 8:
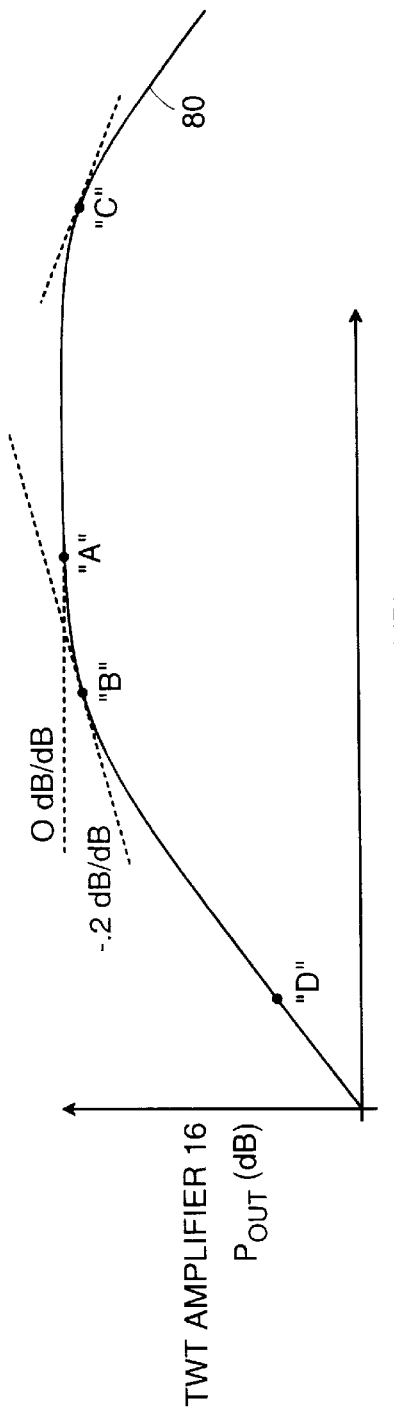
FIG. 8 shows a gain curve of a TWT amplifier used in the transmitter of FIG. 1.
Figure 9:
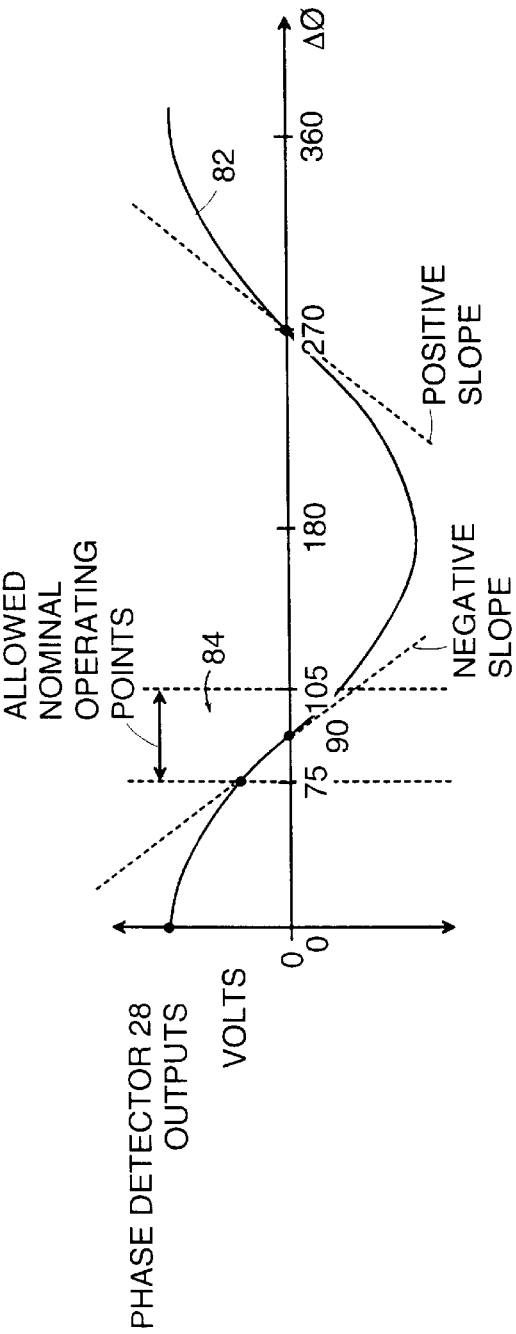
FIG. 9 is a curve showing the relationship between phase difference, $\Delta\phi$, in signals fed to a phase detector used in the transmitter of FIG. 1 and output voltage produced by such phase detector.

Once the AM noise calibration mode results in the microcontroller 44 determining the nominal operating point, here 0.2 db/db on the gain curve 80, such point (i.e., point "B" in FIG. 8) is stored in the D/A 48 and such level is held at the second input to the differencing amplifier 40 for use during the normal operating mode and also for the subsequent phase modulation (PM) noise cancellation mode. The microcontroller 44 then initiates the PM noise calibration mode. It is first noted that at the time of system trigger signal on line 12, a priori knowledge of the operating point of the phase detector is not known. The PM noise cancellation loop 22 is a negative feedback loop that requires that the phase of the error signal fed to the phase modulator 26 be 180 degrees out of phase with the incident phase noise components in order to cancel the phase modulation noise. Condition of maximum phase error sensitivity and correct loop polarity exist when the phase of the signals fed to the phase detector 28 are in "phase quadrature", i.e., have a ninety degree phase shift therebetween with proper slope as shown in FIG. 9, to be described. The relationship between phase detector 28 output voltage and phase shift difference $\Delta\phi$ in the signals fed to the phase detector 28 is shown in the curve 82 (FIG. 9). It is first noted that the phase detector 28 produces a zero volt output signal when the relative phase between the signals fed thereto, $\Delta\phi$, are either 90 degrees or 270 degrees. It is next noted that in order for the feedback loop to operate properly (i.e., have stable operation), the phase detector 28 must operate at a nominal operating condition at, or near, (i.e., to within about 15 degrees) a $\Delta\phi$ of 90 degrees with remaining errors being removed by the feedback amplifier 74 operation. This nominal operating point, i.e., $\Delta\phi=90°\pm15°$, during the normal operating mode is established during the PM noise calibration mode.

Figure 6:
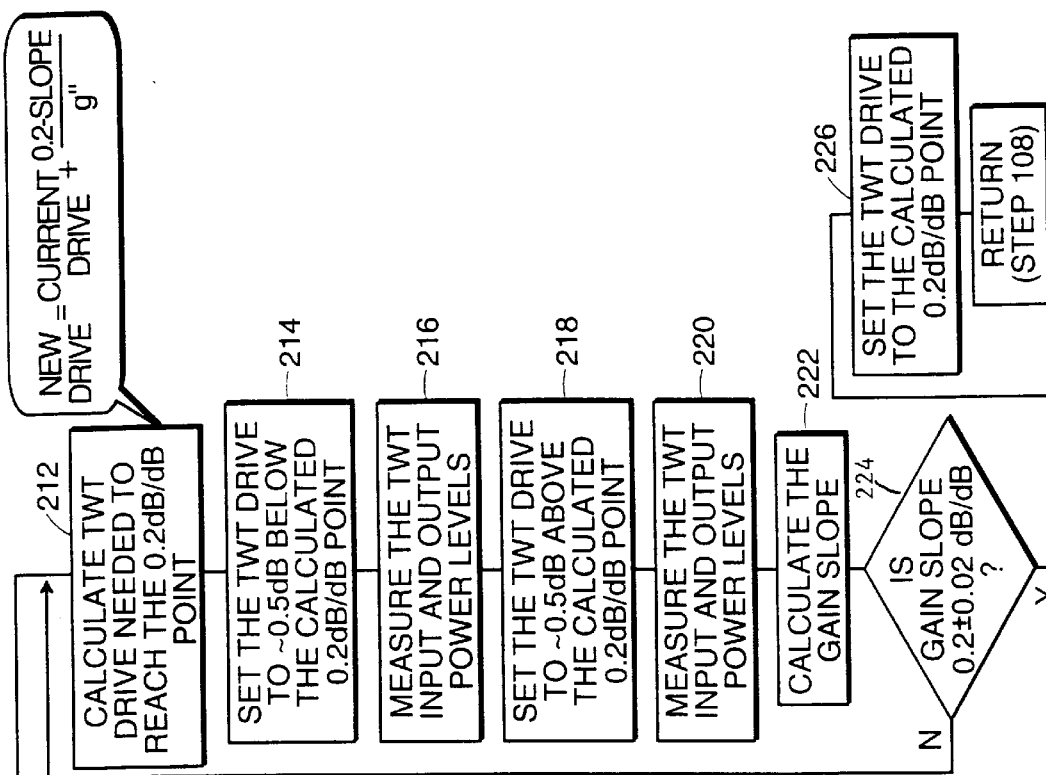
FIG. 6 is a flow diagram of a process used to control the radar transmitter of FIG. 1 during the AM noise calibration mode.
Figure 6:
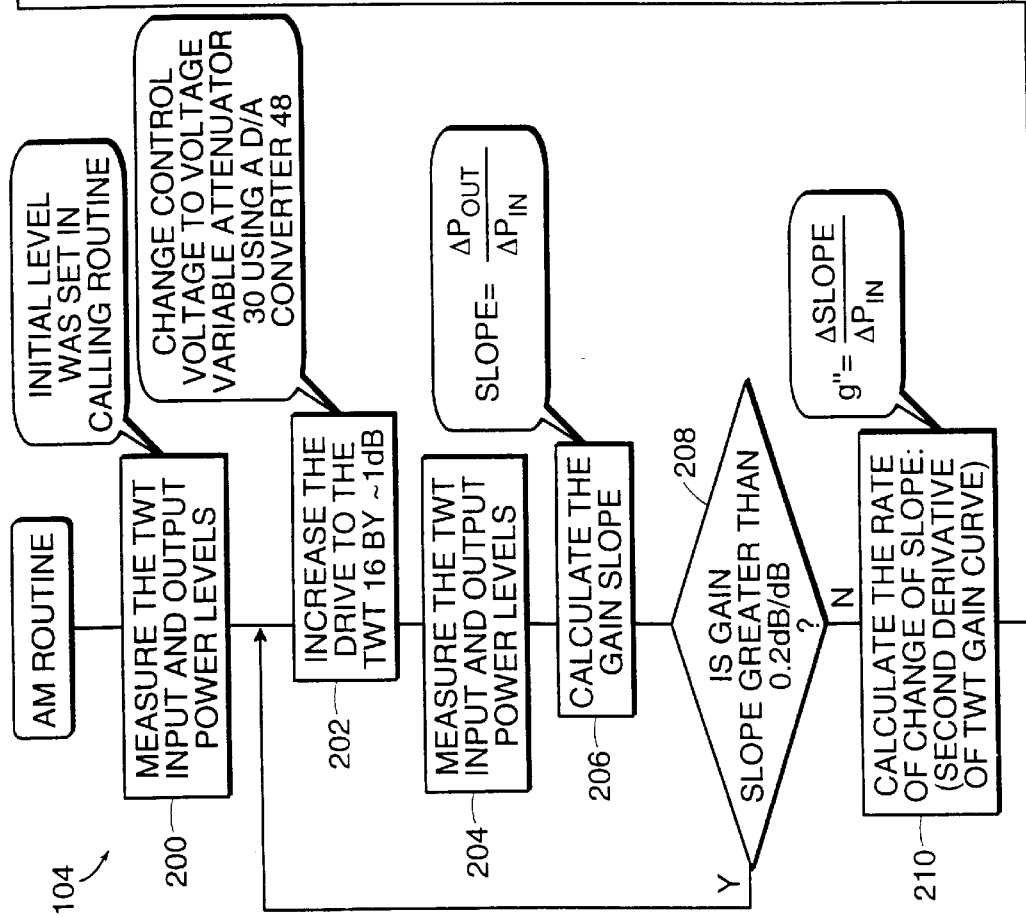

Referring to FIGS. 4 and 6, the AM noise calibration method is shown. As noted in FIG. 3, during Step 102, the microcontroller 44 sets the TWT amplifier 16 to an initial operating drive condition via an initial level of the data on bus 46. The initial operating point, for example point "D" in FIG. 8, is well below the saturation point "A" of the TWT amplifier 16. The microcontroller 44 closes switch 60 and measures the TWT amplifier 16 output power, $P_{out}$ at the initial operating point, $P_{out\ initial}$. It is noted that the signal representative of the input power, $P_{in}$, at the initial operating point, $P_{in\ initial}$, is fed to the microcontroller 44 via diode detector 36 and amplifier 67. In response to each clock pulse fed to the microcontroller 44 via clock pulse line, cp, the microcontroller 44 changes the data on bus 46 to change the attenuator 30 and thereby increase the drive level of the signal to the TWT amplifier 16 a predetermined increment, here for example, about one db (Step 202) to drive the TWT amplifier 16 towards saturation to a second operating point. The microcontroller 44 measures the TWT amplifier 16 input power, $P_{in}$, and output power, $P_{out}$ at the new operating point (i.e., $P_{in\ new}$ and $P_{out\ new}$, respectively (Step 204). The microcontroller 44 calculates a TWT amplifier 16 gain curve 80 slope (i.e., the gain slope "Slope" is the ratio $[P_{out\ new}-P_{out\ initial}]/[P_{in\ new}-P_{in\ initial}]=\Delta P_{out}/\Delta P_{in}$) (Step 206). Thus, the determined gain slope is representative of the difference between measured output powers $\Delta P_{out}$ to measured input powers $\Delta P_{in}$. The microcontroller 44 compares the calculated gain slope to a predetermined reference slope representative of a slope at a predetermined level less than, TWT amplifier saturation; here, to a predetermined slope of 0.2 db/db (Step 208). If the slope, $\Delta P_{out}/\Delta P_{in}$, calculated by the microcontroller 44 in Step 206 is greater than the predetermined slope, i.e., the TWT amplifier is operating at a point substantially less than saturation, the microcontroller 44 again increases the drive to the TWT amplifier by returning to Step 202 and repeats Steps 202, 204, 206 and 208 until the TWT amplifier 16 is driven to a point when the gain slope is less than the predetermined slope of here 0.2 db/db, a slope near TWT amplifier 16 saturation. Thus, when the microcontroller 44 determines that the gain slope is less that 0.2 db/db, i.e., near TWT amplifier 16 saturation in Step 208, the microcontroller 44 calculates the rate of change of the gain slope (i.e., $g''=\Delta Slope/\Delta P_{in}$, the second derivative of the TWT gain curve) (Step 210).

Next, the microcontroller 44 calculates the level of the data on bus 46 needed to drive the TWT amplifier 16 to reach the final operating point where the Slope is at the predetermined level of here 0.2 db/db (Step 212). Thus, using the slope, SLOPE, calculated by the microcontroller 44 in Step 206 when the calculated gain slope was less than 0.2 db/db, the second derivative of the TWT gain slope (i.e., g") calculated by the microcontroller 44 in Step 210, and the current drive level, "Current Drive" (i.e., the data on bus 46 when the SLOPE was achieved in Step 206) the microcontroller 44 calculates a new TWT drive level, "New Drive" i.e., the data on bus 46, needed to drive the TWT amplifier 16 to an operating point on its gain curve where the TWT gain curve has the slope of 0.2 db/db (i.e., point "B" in FIG. 8), in accordance with:

$$\text{NewDrive} = \text{CurrentDrive} + \frac{[0.2 - \text{SLOPE}]}{g''}$$

Next, In order to ensure that the TWT amplifier 16 is actually at the calculated 0.2 db/db operating point, the microcontroller 44 executes Steps 214 through 224. In Step 214, the microcontroller 44 sets the data on bus 46 to drive the TWT amplifier 16 to a level approximately (~) 0.5 db below the 0.2 db/db operating point calculated in Step 212. In Step 216, the microcontroller 44 measures the TWT amplifier input and output powers $P_{in\ A}$, $P_{out\ A}$ when the TWT amplifier 16 is at the level set in Step 214. In Step 218, the microcontroller 44 sets the data on bus 46 to a level approximately (~) 0.5 db above the 0.2 db/db operating point calculated in Step 212. In Step 220, the microcontroller 44 measures the TWT amplifier input and output powers $P_{in\ B}$, $P_{out\ B}$ when the TWT amplifier 16 is at the level set in Step 218. In Step 222, the microcontroller 44 calculates the gain slope=$[P_{OUT\ B}-P_{OUT\ A}]/[P_{IN\ B}-P_{IN\ A}]$. In Step 224, the microcontroller 44 determines whether the gain slope calculated in Step 222 is to within 0.02 db/db of the operating point described slope of 0.2 db/db; i.e., whether from the measurements taken during Steps 216 and 222 the operating point has a slope of 0.2±0.02 db/db. If not, the microcontroller 44 repeats Steps 212 through 224, as described above until the TWT amplifier 16 is operating at a point on the gain curve 80 (FIG. 8) where the slope is 0.2±0.02 db/db. If it is at such operation point, the data produced by the microcontroller 44 in Step 222 is used to set the TWT amplifier 16 drive level (Step 226) and is stored in the D/A 48 for use during the subsequent PM noise calibration mode and normal operating mode. This completes the AM noise calibration mode with the microcontroller 44 proceeding to Step 108 in FIG. 3.

Referring now to FIG. 7, the method the microcontroller 44 performs the PM noise calibration mode is shown. The PM noise cancellation loop 22 removes variations in the phase of the signal produced at the output of the TWT amplifier 16. This is achieved by having changes in the phase at the TWT amplifier 16 output signal sensed by the phase detector 28 which produces a variation in the phase of the phase modulator 26 so that, because of negative feedback, these sensed phase changes are canceled.

It should be noted that at the time the system trigger is received on line 12, the phase shift provided by the phase shifter 58 is unknown. The output of the phase detector 28 is a function of the difference in phase, $\Delta\phi$ between the signals fed to the phase detector 28 from power divider 24 and phase shifter 58 as described above in connection with FIG. 9. It is noted that the output of the phase detector 28 is zero volts at two different phase differences, $\Delta\phi$s; i,e., when the phase difference $\Delta\phi$ of the signals fed to the phase detector 28 is 90 degrees and when the phase difference $\Delta\phi$ of the signals fed to the phase detector 28 is 270 degrees. That is, a zero volt output is produced by the phase detector 28 when the signals fed to the phase detector 28 from power divider 24 and phase shifter 58 are in quadrature. In order for the PM noise cancellation loop 22 to function as a stable, negative feedback loop, it is necessary that the phase detector 28 operate about the 90 degree quadrature phase difference, $\Delta\phi$, point and not the 270 degree quadrature point. That is, when the phase shifter 58 operates about the 90 degree quadrature point, the output voltage to phase difference $\Delta\phi$ slope is negative (i.e., a positive (increasing) change $\Delta\phi$ results in a negative (decreasing) change in output voltage) thereby providing a stable negative feedback PM noise cancellation loop 22. If, on the other hand, the phase shifter 58 operated about the 270 degree quadrature point, the output voltage to phase difference $\Delta\phi$ slope is positive (i.e., a positive (increasing) change $\Delta\phi$ results in a positive (increasing) change in output voltage) thereby providing a unstable positive feedback PM noise cancellation loop 22. During the PM noise calibration mode, the microcontroller 44 drives the phase shifter 58 so it operates on the negative voltage-phase difference $\Delta\phi$ slope; i.e., an increase in phase difference, $\Delta\phi$ produces a decrease in phase detector 28 output voltage and to within a predetermined $\Delta\phi$, here ±15 degrees of quadrature. This, operating point is then used as the nominal operating point during the subsequent normal operating mode. (It should be noted that the nominal operating point could have been the 270 degree operating point with an additional inversion in the feedback loop.)

As noted above, in Step 102 (FIG. 3) the microcontroller 44 sets, via the signal on line 12, an initial operating point for the phase shifter 58. It should be understood that the actual absolute phase shift produced by the phase shifter 58 to the signal fed thereto by directional coupler 54 is not known at time of system trigger signal on line 12. In Step 300, the microcontroller 44 measures the output of the phase detector 28 at the initial operating point.

Next, in Step 302, the microcontroller 44 determines, from the voltage produced at the output of the phase detector 28, whether the phase difference, $\Delta\phi$, to the phase detector 28 is less than zero degrees from a quadrature point; i.e., from either 90 degrees or 270 degrees, it being understood that the voltage produced by the phase detector 28 is the same regardless of whether the initial operating point of the phase shifter 58 establishes a $\Delta\phi$ at the phase detector 28 proximate to the 90 degree quadrature point or to the 270 degree quadrature point. If the microcontroller 44 determines that $\Delta\phi$ is less than zero degrees from quadrature, the microcontroller 44 changes the level on bus 68 to increase the phase shift produced by phase shifter 58 by approximately 60 degrees (Step 304). The microcontroller 44 repeats Steps 300, 302 and 304 until $\Delta\phi$ is greater than zero degrees from quadrature. In effect, Steps 300, 302 and 304 ensure that the phase detector 28 has passed through one of the quadrature points; i.e., a zero crossing in the voltage vs. $\Delta\phi$ curve has occurred.

Steps 306 through 310 are performed by the microcontroller 44 to drive the phase detector 28 to an operating point on the negative slope of the voltage vs. $\Delta\phi$ curve. In Step 306, the microcontroller 44 increases the phase shift of phase shifter 58 by approximately 60 degrees. Next, the microcontroller 44 measures the output voltage of the phase detector 28 (Step 308). The microcontroller 44 then determines whether the phase error is greater than zero degrees from a quadrature point (Step 310). If the phase error is greater than zero degrees from a quadrature point, the microcontroller 44 repeats Steps 306, 308 and 310 until the microcontroller 44 determines that the phase error is less than zero degrees from a quadrature point (Step 310). In this condition, the microcontroller 44 has determined a level on bus 68 where the phase detector 28 is operating proximate to the negative slope of the voltage vs. $\Delta\phi$ curve; i.e., proximate the 90 degree $\Delta\phi$ quadrature operating point.

The microcontroller 44 then performs Steps 312 through 322 to set the phase shifter 58 so that the phase detector 28 is at an operating point of 90 degrees ±15 degrees for use during the subsequent normal operating mode. In Step 312, the microcontroller 44 determines whether the phase error $\Delta\phi$ is greater than +15 degrees from 90 degrees. If the phase error $\Delta\phi$ is greater than +15 degrees from 90 degrees, the microcontroller 44 reduces the phase shift provided by the phase shifter 58 by one half the last phase shift change (Step 314). Next, the microcontroller 44 measures the output voltage of the phase detector 28 (Step 320) and again determines whether the phase error $\Delta\phi$ is greater than +15 degrees from 90 degrees (Step 312). Steps 314, 320 and 312 are repeated until the microcontroller 44 determines that the phase error $\Delta\phi$ is less than +15 degrees from 90 degrees after which the microcontroller 44 determines whether the phase error $\Delta\phi$ is less than −15 degrees from 90 degrees (Step 316). If the phase error $\Delta\phi$ is less than −15 degrees from 90 degrees, the microcontroller 44 increases the phase shift provided by the phase shifter 58 by one half the last phase shift change (Step 318). Next, the microcontroller 44 measures the output voltage of the phase detector 28 (Step 320) and again determines whether the phase error $\Delta\phi$ is greater than +15 degrees from 90 degrees (Step 312). If it is, the microcontroller 44 repeats Steps 314 through 312; if not, the microcontroller 44 repeats Step 316. The method continues until the microcontroller 44 determines in Step 316 that the phase error $\Delta\phi$ is less than −15 degrees from 90 degrees. Thus, the level now produced by the microcontroller 44 will place the phase shifter 58 at a point where the phase shift of the signal produced will be 90 degrees ±15 degrees relative to the phase shift of the signal produced at phase detector 28.

In summary, the PM noise calibration mode sequentially drives the phase detector 58 through a zero crossing to an operating point on the negative slope of the voltage vs. $\Delta\phi$ curve, and then iteratively drives the operating point closer to the 90 degree operating point until an operating point is within a predetermined tolerance, here 15 degrees, of the 90 degree operating point (i.e., within region 84, FIG. 9).

Other embodiments are within the spirit and scope of the appended claims.

What is claimed is:

1. A method for suppressing amplitude modulated noise, comprising the steps of:

driving an amplifier towards saturation while monitoring a ratio of amplifier input power to output power;

terminating said driving when the monitored ratio indicates the amplifier is operating at, or near saturation to suppress said amplitude modulation noise.

2. A method for transmitting radio frequency energy in response to a trigger signal, comprising the steps of:

feeding a radio frequency signal to an amplifier, such amplifier being operated at an initial operating point;

successively changing the operating point of the amplifier in response to the trigger signal to drive the amplifier towards saturation;

monitoring a ratio of amplifier input power to output power as the amplifier is being driven towards saturation;

terminating said drive when the monitored ratio indicates the amplifier is operating at, or near saturation.

3. A method for operating a traveling wave tube, comprising the steps of:

(a) operating the amplifier at a first operating point;

(b) measuring input power to the amplifier and output power from the amplifier at the first operating point;

(c) increasing power in a signal fed to the amplifier to drive the amplifier towards saturation to a second operating point;

(d) measuring input power to the amplifier and output power from the amplifier at the output power at the second operating point;

(e) determining a gain slope ratio representative of the difference between measured output powers to measured input powers;

(f) comparing the determined gain slope ratio to a predetermined reference value representative of a point at a predetermined level below amplifier saturation;

(g) repeating steps (c) through (f) until the determined gain slope ratio is less than the predetermined reference value;

(h) when the predetermined gain slope reaches a level less than the predetermined reference value, calculating a ratio of a pair of successive changes in the gain slope ratio to changes in input power level associated with such pair of successive gain slope changes;

(i) calculate a drive level required to enable the amplifier to reach the predetermine value representative of the operating point at a predetermined level less than amplifier saturation;

(j) setting the operating point of the amplifier to a point a predetermined level above and below the drive level calculated in step (i);

(k) measuring the amplifier input power and output power at the drive level setting in step (j);

(l) calculating the gain slope from the input power and output power measured in step (k);

(m) comparing the gain slope calculated in step (l) to the predetermined value;

(n) repeating steps (i) through (m) until the gain slope calculated in step (l) substantially reaches the predetermined value; and then (o) setting the amplifier drive level to the gain slope calculated in step (l).

4. A method for canceling phase modulated noise in a phase modulation cancellation system having a phase detector fed by a portion of an input signal, an electronically controllable phase modulator fed by another portion of the input signal as a first input signal to the electronically controllable phase modulator, and a feedback phase shifter fed by an output from the phase cancellation system for changing the phase shift of the signal fed thereto in accordance with a control signal, such phase shifted signal being fed as a second input signal to the electronically controllable phase modulator, comprising the steps of:

(a) during a calibration mode:
  (i) setting an initial value for the feedback phase shifter with the control signal;
  (ii) sequentially changing phase shift with the control signal while measuring a voltage produced by the phase detector to control the phase shift provided by the electronically controllable phase modulator to the signal fed thereto;
  (iii) determining when the voltage produced by the phase detector passes through a predetermined level with a predetermined slope polarity; and (b) during a subsequent normal operating mode, setting the phase detector to such value as a nominal operating point.

5. Apparatus for canceling noise in an amplifier, comprising:

an amplitude modulation cancellation feedback loop, fed by a signal representative of a predetermined amplifier operating point slightly less than amplifier saturation, for determining, during an amplitude modulation calibration mode, an nominal amplifier input signal level to drive the amplifier to such predetermined operating point;

a phase modulation cancellation loop, including a phase detector fed by a portion of the signal fed to the amplifier and a portion of the amplifier output, for determining, during a phase modulation calibration mode, a nominal phase modulation cancellation phase shift;

an amplitude level control feedback loop, response to detected noise power in the signal fed to the amplifier for adjusting the level such amplifier input signal accordance with such detected power and with the amplifier operating about the nominal amplifier input signal level determined during the amplitude modulation cancellation phase and with the phase provided to the input signal being changed about the nominal phase modulation cancellation phase shift determined during the phase modulation calibration mode.

6. The apparatus recited in claim 5 wherein the amplifier is a radio frequency amplifier.

7. The apparatus recited in claim 6 wherein the radio frequency amplifier is a travelling wave tube amplifier.

8. Apparatus for canceling amplitude modulation noise at an output of an amplifier, comprising:

an amplitude modulation cancellation feedback loop, fed by a signal representative of a predetermined amplifier operating point slightly less than amplifier saturation, for determining, during an amplitude modulation calibration mode, an nominal amplifier input signal level to drive the amplifier to such predetermined operating point;

an amplitude level control feedback loop, response to detected noise power a signal fed to the amplifier for adjusting the level of such amplifier input signal in accordance with such detected power and with the amplifier operating about the nominal amplifier input signal level determined during the amplitude modulation cancellation phase.

9. The apparatus recited in claim 8 wherein the amplifier is a radio frequency amplifier.

10. The apparatus recited in claim 9 wherein the radio frequency amplifier is a travelling wave tube amplifier.

11. A radar transmitter, comprising;

a radio frequency local oscillator for producing a radio frequency signal;

a phase modulator fed by a portion of the radio frequency signal;

a phase detector fed by a portion of the radio frequency signal, such phase detector producing an output to control the phase modulator;

an first electronically controlled variable attenuator fed by the phase modulator;

an amplifier fed the attenuator;

a differencing amplifier fed by a portion of a signal produced by the amplifier and a reference voltage;

a second electronically controllable variable attenuator fed by a portion of the signal produced by the amplifier;

a travelling wave tube amplifier, fed by the second electronically controllable variable attenuator;

a detector fed by a portion of the signal produced by the amplifier;

an electronically controllable phase shifter fed by a portion of the signal produced by the amplifier, such phase shifter feeding the phase detector;

a microcontroller;

a first switch controllable by the microcontroller for selectively coupling the output of the detector to the microcontroller during an amplitude modulation calibration mode, such microcontroller producing the reference level for a subsequent phase modulation noise calibration mode and a then subsequent normal operating mode, such first switch decoupling the detector from the microcontroller during the phase modulation mode and the normal operating mode;

a second switch fed by the phase detector controllable by the microcontroller for coupling the phase detector to the microcontroller during a phase modulation calibration mode, such microcontroller adjusting the electronically controllable phase shifter during the phase modulation noise calibration mode to produce a nominal operating point of operation for the phase detector during a subsequent normal operating mode and for decoupling the phase detector from the microcontroller during the amplitude modulation noise calibration mode and the normal operating mode;

a pair of switches controllable by the microcontroller for coupling the phase detector to the electronically adjustable phase modulator and the detector to the second electronically controllable attenuator during the normal operating mode and for decoupling the phase detector from the electronically adjustable phase modulator and the detector from the second electronically controllable attenuator during the amplitude modulation noise calibration phase and the phase modulation noise calibration mode.

12. The radar transmitter recited in claim 11 where in amplifier is a radio frequency amplifier.

13. The amplifier recited in claim 12 wherein the radio frequency amplifier is a travelling wave tube amplifier.

14. A method for operating an amplifier, comprising the steps of:

feeding a signal to the amplifier, such amplifier being operated at an initial operating point;

successively changing the operating point of the amplifier in response to the trigger signal to drive the amplifier towards saturation;

monitoring a ratio of amplifier input power to output power as the amplifier is being driven towards saturation;

terminating said drive when the monitored ratio indicates the amplifier is operating at, or near saturation.

15. A method for operating an amplifier, comprising the steps of:

(a) operating the amplifier at a first operating point;

(b) measuring input power to the amplifier and output power from the amplifier at the first operating point;

(c) increasing power in a signal fed to the amplifier to drive the amplifier towards saturation to a second operating point;

(d) measuring input power to the amplifier and output power from the amplifier at the output power at the second operating point;

(e) determining a gain slope ratio representative of the difference between measured output powers to measured input powers;

(f) comparing the determined gain slope ratio to a predetermined reference value representative of a point at a predetermined level below amplifier saturation;

(g) repeating steps (c) through (f) until the determined gain slope ratio is less than the predetermined reference value;

(h) when the predetermined gain slope reaches a level less than the predetermined reference value, calculating a ratio of a pair of successive changes in the gain slope ratio to changes in input power level associated with such pair of successive gain slope changes;

(i) calculate a drive level required to enable the amplifier to reach the predetermine value representative of the operating point at a predetermined level less than amplifier saturation;

(j) setting the operating point of the amplifier to a point a predetermined level above and below the drive level calculated in step (i);

(k) measuring the amplifier input power and output power at the drive level setting in step (j);

(l) calculating the gain slope from the input power and output power measured in step (k);

(m) comparing the gain slope calculated in step (l) to the predetermined value;

(n) repeating steps (i) through (m) until the gain slope calculated in step (l) substantially reaches the predetermined value; and then (o) setting the amplifier drive level to the gain slope calculated in step (l).

16. A method for operating a phase modulation cancellation system having a phase detector fed by a portion of an input signal, an electronically controllable phase modulator fed by another portion of the input signal as a first input signal to the electronically controllable phase modulator, and a feedback phase shifter fed by an output from the phase cancellation system for changing the phase shift of the signal fed thereto in accordance with a control signal, such phase shifted signal being fed as a second input signal to the electronically controllable phase modulator, comprising the steps of:

(a) during a calibration mode:
(i) setting an initial value for the feedback phase shifter with the control signal;
(ii) sequentially changing phase shift with the control signal while measuring a voltage produced by the phase detector to control the phase shift provided by the electronically controllable phase modulator to the signal fed thereto;

(iii) determining when the voltage produced by the phase detector passes through a predetermined level with a predetermined slope polarity; and (b) during a subsequent normal operating mode, setting the phase detector to such value as a nominal operating point.

17. A system, comprising;

an oscillator for producing a signal;

a phase modulator fed by a portion of the oscillator produced signal;

a phase detector fed by a portion of the oscillator produced, such phase detector producing an output to control the phase modulator;

an first electronically controlled variable attenuator fed by the phase modulator;

an amplifier fed the attenuator;

a differencing amplifier fed by a portion of a signal produced by the amplifier and a reference voltage;

a second electronically controllable variable attenuator fed by a portion of the signal produced by the amplifier;

an amplifier, fed by the second electronically controllable variable attenuator;

a detector fed by a portion of the signal produced by the amplifier;

an electronically controllable phase shifter fed by a portion of the signal produced by the amplifier, such phase shifter feeding the phase detector;

a microcontroller;

a first switch controllable by the microcontroller for selectively coupling the output of the detector to the microcontroller during an amplitude modulation calibration mode, such microcontroller producing the reference level for a subsequent phase modulation noise calibration mode and a then subsequent normal operating mode, such first switch decoupling the detector from the microcontroller during the phase modulation mode and the normal operating mode;

a second switch fed by the phase detector controllable by the microcontroller for coupling the phase detector to the microcontroller during a phase modulation calibration mode, such microcontroller adjusting the electronically controllable phase shifter during the phase modulation noise calibration mode to produce a nominal operating point of operation for the phase detector during a subsequent normal operating mode and for decoupling the phase detector from the microcontroller during the amplitude modulation noise calibration mode and the normal operating mode;

a pair of switches controllable by the microcontroller for coupling the phase detector to the electronically adjustable phase modulator and the detector to the second electronically controllable attenuator during the normal operating mode and for decoupling the phase detector from the electronically adjustable phase modulator and the detector from the second electronically controllable attenuator during the amplitude modulation noise calibration phase and the phase modulation noise calibration mode.

18. The system recited in claim 17 wherein the amplifier is a radio frequency amplifier.

19. The amplifier recited in claim 18 wherein the radio frequency amplifier is a travelling wave tube amplifier.

* * * * *